United States Patent [19]

Dobrovolny

[11] Patent Number: 4,480,338

[45] Date of Patent: * Oct. 30, 1984

[54] LOWPASS-HIGHPASS ELECTRONIC SWITCH

[75] Inventor: Pierre Dobrovolny, North Riverside, Ill.

[73] Assignee: Zenith Electronics Corporation, Glenview, Ill.

[*] Notice: The portion of the term of this patent subsequent to Mar. 6, 2001 has been disclaimed.

[21] Appl. No.: 528,692

[22] Filed: Sep. 1, 1983

Related U.S. Application Data

[63] Continuation of Ser. No. 353,694, Mar. 1, 1982, Pat. No. 4,435,841.

[51] Int. Cl.³ ................... H04B 1/16; H03H 7/00
[52] U.S. Cl. ........................... 455/188; 455/190; 455/197; 455/315; 455/340; 455/284; 333/103; 333/132; 333/176
[58] Field of Search ............. 455/131, 180, 188, 190, 455/191, 197, 284, 286, 291, 292, 315, 316, 339, 340; 333/167, 168, 174, 175, 176, 178, 132, 180, 103, 129

[56] References Cited

U.S. PATENT DOCUMENTS

| | | | |
|---|---|---|---|
| 2,136,659 | 11/1938 | Wood | 455/284 |
| 2,307,979 | 1/1943 | Whisk | 333/176 |
| 3,514,727 | 5/1970 | Matsumoto et al. | 333/167 |
| 3,980,957 | 9/1976 | Putzer | 455/180 |
| 4,002,986 | 1/1977 | Ma | 455/180 |
| 4,247,953 | 1/1981 | Shinagawa et al. | 455/180 |
| 4,322,856 | 3/1982 | Ohta et al. | 455/190 |

FOREIGN PATENT DOCUMENTS

| | | | |
|---|---|---|---|
| 2746931 | 4/1978 | Fed. Rep. of Germany | 455/180 |
| 104219 | 8/1979 | Japan | 455/188 |

Primary Examiner—Jin F. Ng

[57] ABSTRACT

A multichannel communications receiver, e.g. a CATV converter, includes a switched filter for reducing third order intermodulation distortion by limiting the number of channels processed by the receiver. In a preferred embodiment, the filter is switchable between a highpass and a lowpass configuration by a control signal supplied to two switching diodes. The input and output of the filter are coupled by a mutual inductance which partially compensates for the effect of parasitic inductance at higher frequencies.

3 Claims, 9 Drawing Figures

LOWPASS-HIGHPASS ELECTRONIC SWITCH

This application is a continuation, of application Ser. No. 353,694, filed Mar. 1, 1982, now U.S. Pat. No. 4,435,841.

BACKGROUND OF THE INVENTION

The present invention relates generally to multichannel communications receivers such as used in cable television (CATV) systems and, more particularly, to improvements for reducing third order intermodulation distortion in these types of receivers.

The number of channels characterizing CATV systems has greatly expanded over the years to a point where it is presently not uncommon to provide up to 50 or more different channels of programming for transmission to a subscriber's receiver. While the large number of channels provided by such a system affords the benefit of greatly increased programming variety, signal reception is somewhat degraded by a corresponding increase in distortion introduced at the signal receiver. In particular, it is well known that as the number of channels provided by a CATV system increases much beyond 12, the predominant distortion limiting performance changes from cross-modulation to third order intermodulation. In fact, it has been found that third order spurious signals that fall in the spectrum of interest increase exponentially as the number of channels increases.

Third order intermodulation distortion is produced by non-linear circuit components which develop spurious beat products that stack or accumulate in a communications receiver when the broadcast channels are evenly spaced (e.g. in a CATV system where the channels are spaced 6 MHz apart). This stacking or accumulation of third order intermodulation beat products, which is manifested in the reproduced video image in terms of increased background noise, is illustrated in FIGS. 1A–1C which represent the frequency spectra of a communications system characterized by two, three and four channels respectively. Referring initially to FIG. 1A, the two bold lines represent two carriers $f_1$ and $f_2$ transmitted over adjacent channels of the system. These two carriers, when processed by a receiver having non-linear circuit components, produce third order intermodulation distortion products $2f_1-f_2$ and $2f_2-f_1$ at the intercarrier spacing. In FIG. 1B, the bold lines represent three carriers $f_1$, $f_2$, and $f_3$ transmitted over three equally spaced channels and the third order intermodulation products resulting therefrom. It will be noted that in addition to products of the form $2f_x-f_y$ (commonly referred to as two tone third order products) further products of the form $f_x+f_y-f_z$ are developed, the latter form of intermodulation product frequently being referred to as triple beat distortion. These third order intermodulation products are incoherent with the channel carriers superimposing a noisy background thereon. FIG. 1C represents a communication system wherein four carriers $f_1$, $f_2$, $f_3$, $f_4$, are transmitted over four equally spaced channels. It will be observed that the third order intermodulation products (of the form $2f_x-f_y$ and $f_x+f_y-f_z$) begin to accumulate or stack about the carriers to further increase the distortion and background noise characterizing the system. As the number of channels is increased further, the stacking effect of the third order intermodulation products increases at an exponential rate to a point where the introduced distortion becomes quite objectionable.

Prior art attempts to reduce the effects of third order intermodulation distortion have included efforts to develop more linear receiver components, but these efforts have not yet proven satisfactory. Sometimes, an attempt is made to reduce third order intermodulation distortion by operating the channel receivers at reduced power levels. However, this is not always possible where the receiver is designed for an existing broadcasting medium.

It is accordingly a basic object of the present invention to provide an improved technique for reducing third order intermodulation distortion in a multichannel communications receiver.

It is a further object of the invention to provide a circuit for reducing the level of intermodulation and nonlinear products in a multichannel communications receiver without requiring a corresponding reduction in operating power levels.

It is yet a further object of the invention to provide a circuit of the foregoing type which may be implemented using a minimum number of circuit components and which is relatively inexpensive to manufacture.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the several figures and in which:

DESCRIPTION OF PREFERRED EMBODIMENTS

Figure 1A:
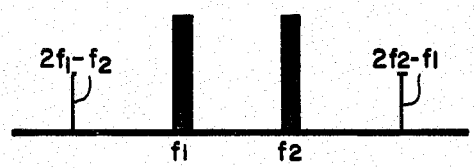
FIGS. 1A–1C graphically illustrate the effect of third order intermodulation distortion in a communications receiver processing communications signals broadcast over two, three and four channels respectively.
Figure 1B:
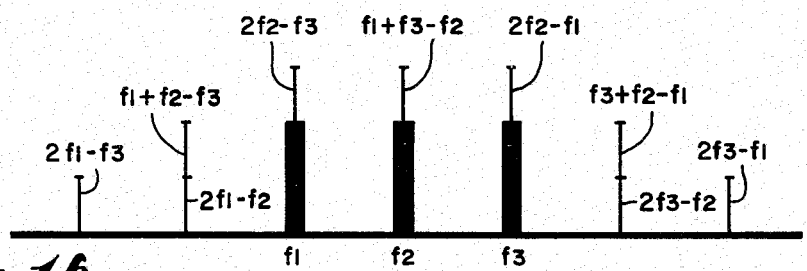
Figure 1C:
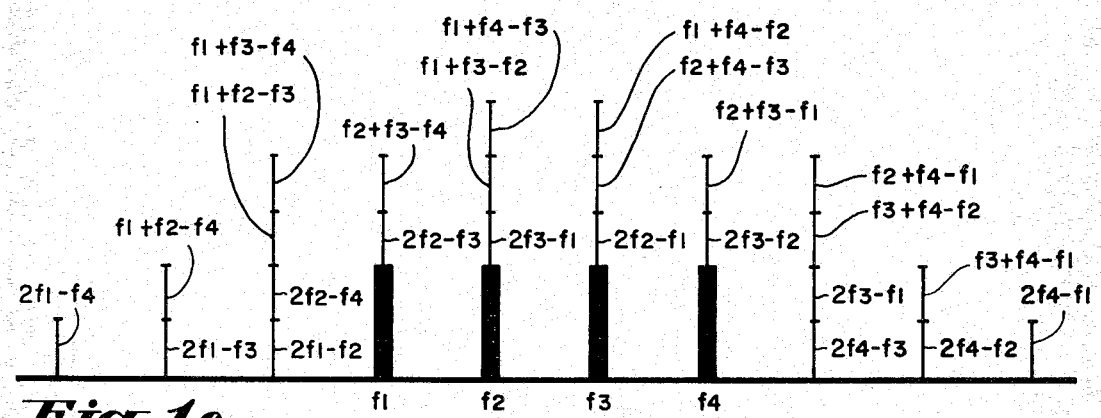
Figure 2:
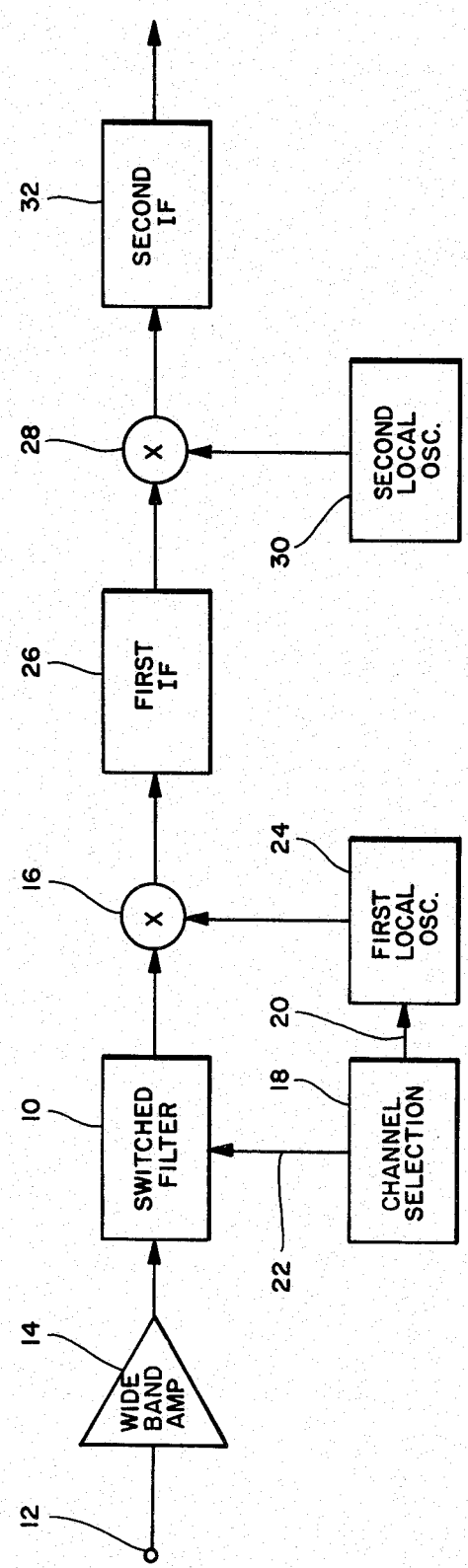
FIG. 2 is a block diagram of one embodiment of a multichannel communications receiver constructed according to the present invention.

Referring now to the drawings and, in particular, to FIG. 2, there is illustrated one embodiment of a multichannel communications receiver incorporating a switched filter 10 according to the present invention for reducing the level of nonlinear products in the receiver. While the receiver may take various forms, a double conversion arrangement of the type frequently employed in multichannel CATV receivers is illustrated for exemplary purposes and should not be taken as imposing any limitations on the invention.

With further reference to FIG. 2, the receiver comprises an input terminal 12 developing signals broadcast over a plurality of CATV channels. In practice, up to 50 channels or more may be provided in a frequency spectrum between about 50 and 450 MHz, each channel including a signal carrier spaced one from the next by 6 MHz. The received signals developed at input terminal 12 in response to the transmitted carriers of all the broadcast channels are coupled through a wide band amplifier 14 to an input of switched filter 10 and therefrom to an input of a first mixer 16. A channel selection device 18, which may be entirely conventional in design, is operative for developing a first control signal on a output line 20, representing a channel selected for viewing and for developing a second control signal on a output line 22 representing a band of channels encompassing the selected channel.

The first control signal developed on output line 20 of channel selection device 18 is coupled to a variable frequency first local oscillator 24 which, in response thereto, applies an appropriate local oscillator signal to a second input of mixer 16 such that the signal carrier of the selected channel is converted to a first predetermined intermediate frequency (IF) signal. This first IF signal is processed by a first IF stage 26, tuned to the first predetermined intermediate frequency, and then coupled to an input of a second mixer 28. Mixer 28, in response to a fixed frequency second local oscillator 30, converts the first IF signal to a second predetermined IF signal. The second IF signal is processed by a second IF stage 32, tuned to the second predetermined intermediate frequency, whose output represents the signals broadcast over the selected CATV channel and may be coupled, for example, to the antenna terminals of a conventional television receiver for viewing.

It will be recalled that signal carriers transmitted over all active CATV channels are coupled from input terminal 12 to the input of switched filter 10 by wide band amplifier 14. In addition, if switched filter 10 was not provided at the output of wide band amplifier 14, all of the signal carriers would be directly coupled to the input of mixer 16. Since mixer 16 is inherently a non-linear device and, since the input to the mixer is normally 5-10 db higher than the input to amplifier 14, the mixer usually introduces most of the nonlinear distortion in the signal path. In accordance with the present invention, this distortion is reduced by providing switched filter 10 at the input of mixer 16. Switched filter 10 is responsive to the second control signal developed on output line 22 of channel selection device 18 for passing to mixer 16 a band of channels encompassing the selected channel, which passed band of channels is substantially less than the total number of channels characterizing the system. By thus limiting the number of channels coupled to mixer 16 the effects of third order intermodulation distortion in the receiver is significantly reduced.

Figure 3:
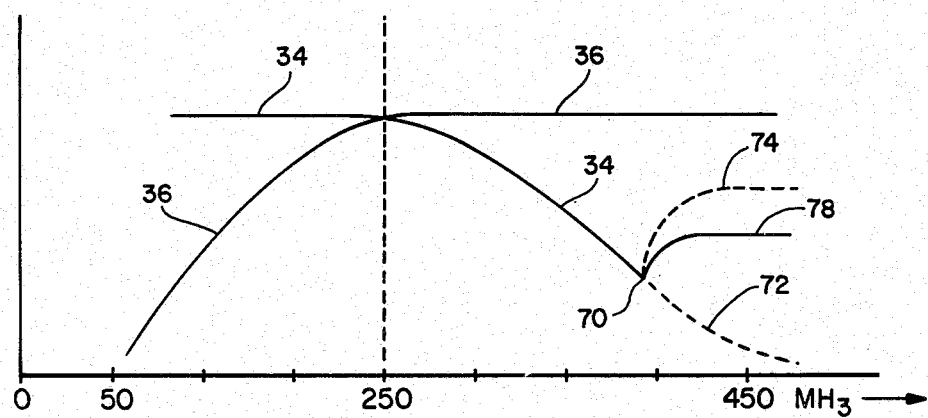
FIG. 3 graphically illustrates the selectivity characteristics of the switched filter of FIG. 2.

In a preferred embodiment of the invention, switched filter 10 is responsive to the second control signal developed on output line 22 of channel selection device 18 for assuming either a lowpass filter characteristic 34 or a highpass filter characteristic 36 as illustrated in FIG. 3. Thus, assuming that channel selection device 18 is operated for selecting a channel within the lowpass band (e.g. between 50-250 MHz) for viewing, a control signal is developed on output line 22 causing switched filter 10 to assume its lowpass filter characteristic 34. The channels within the lowpass band, including the selected channel, are consequently coupled to mixer 16 where they are processed with the output of local oscillator 24. In this regard, it will be appreciated that any third order intermodulation distortion effects introduced by mixer 16 will be reduced in that only one half of the active channels are coupled from input terminal 12 to the input of mixer 16.

In a similar manner, if channel selection device 18 is operated for selecting a channel within the highpass band (e.g. between 250-450 MHz) for viewing, a control signal is developed on output line 22 causing switched filter 10 to assume its highpass characteristic 36. The channels within the highpass band, including the selected channel, are now coupled to mixer 16 where they are processed with the output of local oscillator 24. Again, since only one half of the active channels are coupled to the input of mixer 16, third order intermodulation distortion products are reduced by almost 6 db.

Figure 4:
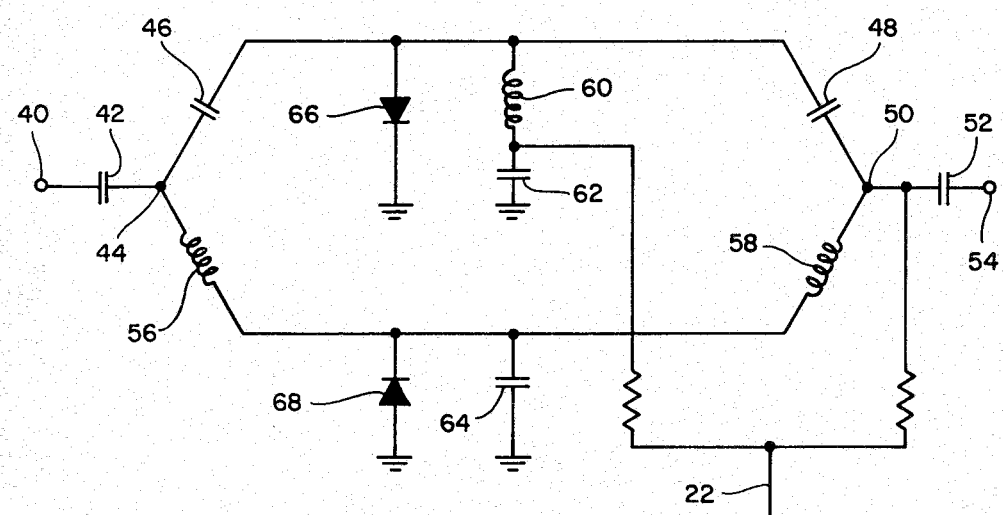
FIG. 4 is an electrical schematic diagram illustrating a preferred embodiment of the switched filter shown generally in FIG. 2.

FIG. 4 illustrates a preferred embodiment of switched filter 10. The filter includes an input terminal 40 connected by a decoupling capacitor 42 to an input node 44. A first circuit branch comprises a pair of series connected capacitors 46 and 48 connected between input node 44 and an output node 50, output node 50 being connected by a second decoupling capacitor 52 to an output terminal 54. A second circuit branch parallel to the first branch comprises a pair of series connected inductors 56 and 58 connected between input and output nodes 44 and 50 respectively. One end of an inductor 60 is connected to the common junction between capacitors 46 and 48, the other end of inductor 60 being connected to ground potential through a capacitor 62. The common junction between inductors 56 and 58 is connected to ground potential by a further capacitor 64.

In accordance with an aspect of the present invention, isolated switching of switched filter 10 between its lowpass and highpass configurations is accomplished using only two switching diodes 66 and 68. The anode of switching diode 66 is connected to the common junction between capacitors 46 and 48 and its cathode is connected to ground potential while the cathode of switching diode 68 is connected to the common junction between inductors 56 and 58 with its annode being connected to ground potential. The second control signal developed on output line 22 of channel selection device 18 is resistively coupled to output node 50 and to the common junction between capacitor 62 and inductor 60.

Figure 5:
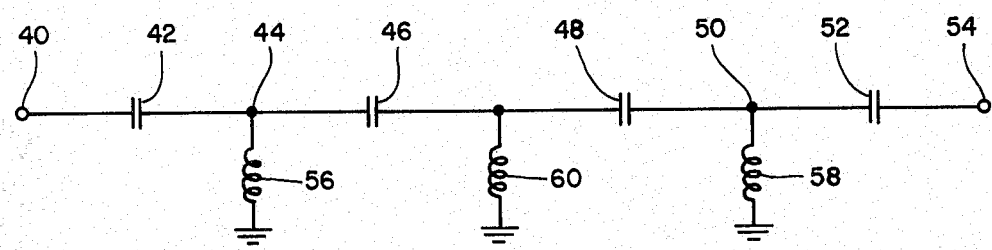
FIG. 5 is an electrical schematic diagram illustrating an equivalent circuit of the filter of FIG. 4 in a first switched mode.

In order to establish the highpass characteristic 36 of switched filter 10, the second control signal on output line 22 is caused to assume a negative potential. As a consequence, switching diode 68 will be rendered conductive while switching diode 66 is rendered non-conductive. An equivalent circuit of switched filter 10 in response to these conditions is shown in FIG. 5. It will be appreciated that this equivalent circuit constitutes a highpass filter exhibiting a highpass filter characteristic as shown by curve 36 in FIG. 3.

Figure 6:
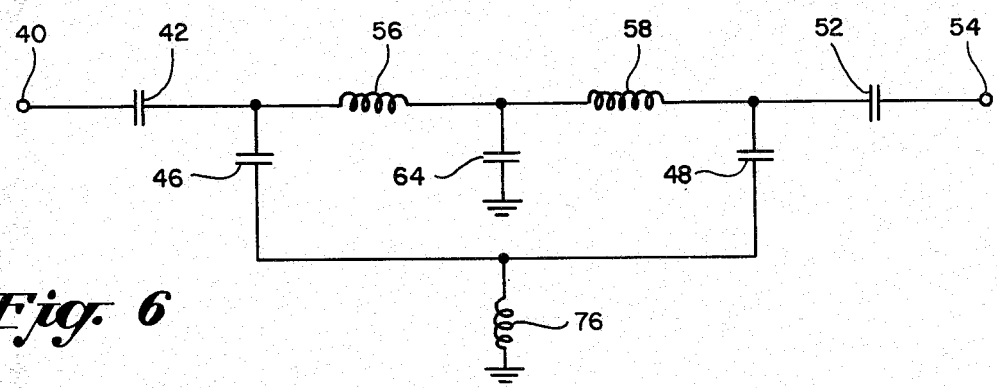
FIG. 6 is an electrical schematic diagram illustrating a second equivalent circuit of the filter of FIG. 4 in a second switched mode.

In order to establish the lowpass characteristic of filter 10, the second control signal on output line 22 of channel selection device 18 is caused to assume a positive potential rendering switching diode 66 conductive and switching diode 68 non-conductive. An equivalent circuit of switched filter 10 in response to these conditions is shown in FIG. 6. This equivalent circuit represents a lowpass filter exhibiting a lowpass filter characteristic as shown by curve 34 of FIG. 3.

Referring back to FIG. 3. it will be observed that the lowpass filter characteristic 34 of switched filter 10 exhibits a perturbation or disturbance at point 70 in the high frequency stop band portion of the curve. Ideally, filter charastic 34 would follow dotted line 72 to insure adequate attentuation of high frequency signals but, due to various stray parasitic effects, the actual lowpass response of switched filter 10 more closely resembles that of doted line 74. A major factor contributing to the undesired response 74 of the lowpass filter characteristic 34 of switched filter 10 is the parasitic inductance of conducting diode 66 which, as represented by inductor 76 in FIG. 6, couples the input of the filter to its output. An aspect of the present invention is the inclusion in switched filter 10 of a circuit for partially compensating for the effects of this parasitic inductance in order to produce an actual filter response as illustrated by solid line 78 in FIG. 3.

Figure 7:
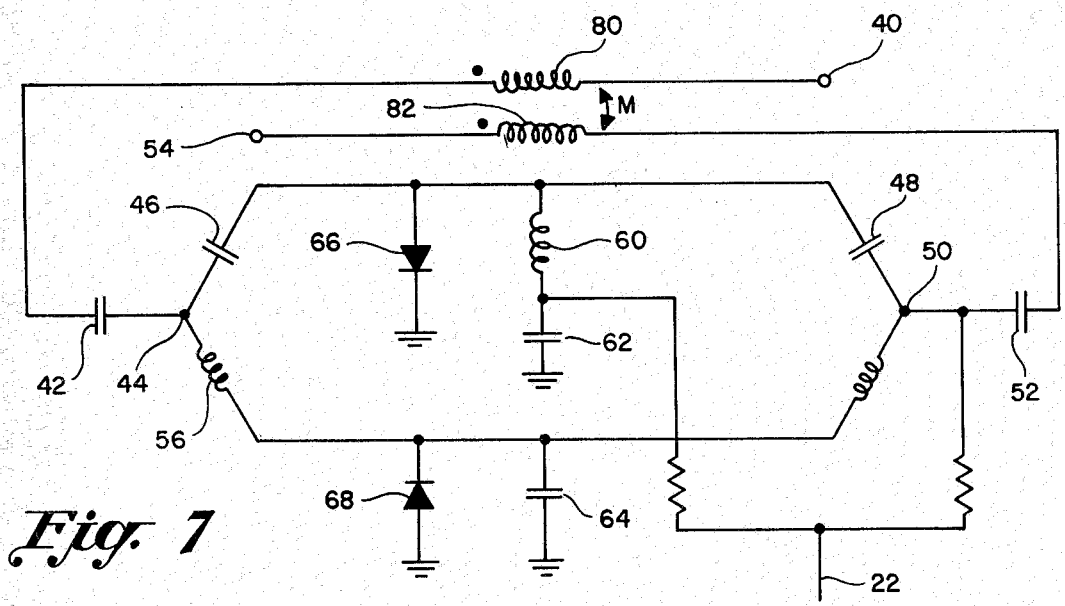
FIG. 7 is an electrical schematic diagram illustrating an improved implementation of the filter of FIG. 4.

FIG. 7 illustrates the aforementioned compensating circuit. The compensating circuit comprises a first inductor 80 connected between input terminal 40 and the decoupling capacitor 42 and a second inductor 82 connected between output terminal 54 and decoupling capacitor 52, inductors 80 and 82 being disposed in close physical proximity for exhibiting a mutual inductance M therebetween. For the particular case of processed RF frequencies reaching 500 MHz and higher, inductors 80, 82 may be implemented by straight wires or two printed lines placed in close proximity to each other. Inductors 80 and 82 are configured such that the mutual inductance M therebetween is in direct phase opposition to the parasitic inductance 76 of conducting diode 66. Therefor, any coupling between the input and output of switched filter 10 effected by parasitic inductance 76 is directly opposed by the inductive coupling between the input and output filter introduced by the mutual inductance of inductors 80 and 82. As a result, the effects of parasitic inductance 76 and to a large extent compensated for by the mutual inductance of inductors 80 and 82 so as to achieve the compensated response of curve 78 rather than the degraded response represented by curve 74 of FIG. 3.

While particular embodiments of the invention have been shown and described, it will be obvious to those skilled in the art that changes and modifications may be made therein without departing from the invention in its broader aspects, and, therefor, the aim in the appended claims is to cover all such changes and modifications as fall within the true spirit and scope of the invention. For example, the receiver of FIG. 2 could be designed with switched filter 10 being located ahead of wideband amplifier 14 so that the nonlinear products produced by the amplifier could also be reduced. While this design would permit the use of a less expensive amplifier, it would at the same time increase the system noise figure.

I claim:

1. A switchable filter for use in a multichannel communications receiver for passing either a first or a second band of channels in response to an input control signal comprising an arrangement of inductors and capacitors, a first switching means and a second switching means, said first and second switching means being responsive to said input control signal for causing said inductors and capacitors to assume a first filter characteristic for passing said first band of channels or to assume a second filter characteristic for passing said second band of channels, at least one of said switching means being characterized by a parasitic reactance coupled across said filter, said filter comprising compensating means coupled thereacross for reducing the effect of said parasitic reactance.

2. A switchable filter according to claim 1 wherein said compensating means comprises means for inductively coupling received signals across said filter in phase opposition to the received signals coupled across said filter by said parasitic reactance.

3. A switchable filter for reducing intermodulation distortion levels in a multichannel communications receiver comprising:
   an input terminal for receiving signals broadcast over a plurality of communications channels;
   an output terminal;
   first and second series connected capacitors coupled between said input and output terminals;
   first and second series connected inductors coupled between said input and output terminals;
   a third capacitor coupled between the common junction of said first and second inductors and a reference potential;
   a third inductor coupled between the common junction of said first and second capacitors and said reference potential; and
   first and second diodes for selectively shunting only the common junction of said first and second capacitors or only the common junction of said first and second inductors directly to reference potential so as to minimize the parasitic reactance of said diodes developed across said filter and whereby to selectively establish either a lowpass or a highpass filter characteristic between said input and output terminals.

* * * * *